(12) United States Patent
Kobayashi et al.

(10) Patent No.: US 6,254,688 B1
(45) Date of Patent: Jul. 3, 2001

(54) CLEANING METHOD

(75) Inventors: Kanji Kobayashi, Saku; Jun Kudo, Akita; Masao Yamaguchi, Komoro; Shinya Yoshihara, Kisakatamachi, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/204,547

(22) Filed: Dec. 3, 1998

(30) Foreign Application Priority Data

Dec. 9, 1997 (JP) .................................................. 9-339111

(51) Int. Cl.$^7$ ........................................................ B08B 3/12
(52) U.S. Cl. .................... 134/1; 134/2; 134/6; 134/9; 134/15; 134/25.4; 134/32; 134/42; 134/902; 15/21.1; 15/77; 15/88.2; 15/88.3; 15/97.1
(58) Field of Search ............................... 15/21.1, 77, 88.2, 15/88.3, 97.1, 102; 134/1, 2, 6, 9, 15, 25.4, 32, 42, 902

(56) References Cited

U.S. PATENT DOCUMENTS

| | | | |
|---|---|---|---|
| 3,137,877 | 6/1964 | Brass | 15/21 |
| 5,092,011 | 3/1992 | Gommori et al. | 15/88.2 |
| 5,317,778 | 6/1994 | Kudo et al. | 15/88.3 |
| 5,524,313 | 6/1996 | Sato | 15/88.3 |
| 5,624,501 | 4/1997 | Gill, Jr. | 134/6 |
| 5,875,507 | 3/1999 | Stephens et al. | 15/102 |
| 5,892,051 | * 4/1999 | Terui | 134/6 |
| 5,893,381 | * 4/1999 | Terui | 134/6 |

FOREIGN PATENT DOCUMENTS

| | | |
|---|---|---|
| 2 276 537 | 10/1994 | (GB) . |
| 61-97836 | 5/1986 | (JP) . |
| 1-304733 | 12/1989 | (JP) . |
| 2-109334 | 4/1990 | (JP) . |
| 2-281733 | 11/1990 | (JP) . |
| 3-131376 | 6/1991 | (JP) . |
| 3-232229 | 10/1991 | (JP) . |
| 405347288 | * 12/1993 | (JP) . |
| 6-5577 | 1/1994 | (JP) . |
| 7-86218 | 3/1995 | (JP) . |
| 8-141532 | 6/1996 | (JP) . |
| 8-318237 | 12/1996 | (JP) . |
| 9-36079 | 2/1997 | (JP) . |
| 9-148293 | 6/1997 | (JP) . |
| 10-270403 | 10/1998 | (JP) . |
| 11-26419 | 1/1999 | (JP) . |
| 1-1276380 | 12/1986 | (SU) . |
| 1276380A1 | 12/1986 | (SU) . |

OTHER PUBLICATIONS

English–language abstract of SU 1458032 A; Feb. 15, 1989.

* cited by examiner

Primary Examiner—Sharidan Carillo
(74) Attorney, Agent, or Firm—Oliff & Berridge, PLC

(57) ABSTRACT

For cleaning a wafer by a cleaning apparatus, a cleaning liquid is contained in a cleaning bath. Leaving two brushes open, the wafer is inserted to the cleaning bath, placed on oscillation and rotation rollers and retained by the rollers. The brushes are closed and the wafer is held by the brushes. Next, the two brushes are rotated while the wafer is oscillated and rotated by the rollers and so on. Furthermore, ultrasonic vibrations are applied to the cleaning liquid in the cleaning bath by an ultrasonic generator. Scrub cleaning with the two brushes and ultrasonic cleaning by ultrasonic vibrations are thereby performed on the wafer.

7 Claims, 11 Drawing Sheets

CLEANING METHOD

BACKGROUND OF THE INVENTION

1. Field of the Invention

The present invention relates to a method and apparatus for cleaning an object such as a wafer using a brush.

2. Description of the Related Art

Manufacturing steps of a semiconductor or a thin-film head include a wafer cleaning step for removing contaminants on a wafer surface as necessary. Such wafer cleaning methods include scrub cleaning. Scrub cleaning is a method of removing deposits on a surface of an object such as a wafer by scrubbing the surface by a brush, applying the rotating brush to the object surface with a cleaning liquid.

Referring to FIG. 12, an example of a scrub cleaning process of related art will now be described. As shown, a wafer 111 as an object to clean is taken out of a loader bath 101 and supplied to a scrub cleaning apparatus 102.

FIG. 13 is a schematic front view of the scrub cleaning apparatus 102. FIG. 14 is a schematic side view of the scrub cleaning apparatus 102. As shown, the scrub cleaning apparatus 102 comprises: a rotating table (not shown); a cylindrical rotating brush 112 placed on the rotating table; and a cleaning liquid ejector 113 placed above the rotating brush 112 and having a plurality of cleaning liquid outlets arranged along the axial direction of the brush 112. For cleaning of the wafer 111 by the scrub cleaning apparatus 102, the wafer 111 is fixed on the rotating table. The rotating brush 112 is positioned so as to touch the surface of the wafer 111. A cleaning liquid 114 is ejected like a shower through the outlets of the cleaning liquid ejector 113 towards the rotating brush 112 and the wafer 111. In this state the wafer 111 is rotated by the rotating table and the rotating brush 112 is rotated. The surface of the wafer 111 is thereby cleaned. The cleaning liquid 114 is detergent or ultrapure water.

Next, as shown in FIG. 12, the wafer 111 is taken out of the scrub cleaning apparatus 102 and transferred to a spin dryer 103 where a rinse step is performed by megasonic rinse. The wafer 111 is then dried by the spin dryer 103. The wafer 111 is taken out of the spin dyer 103 and placed in a carrier 104 by an unloader.

Cleaning while applying a cleaning liquid in a spray to the rotating brush 112 has been generally performed as a scrub cleaning method of related art as described above. Another cleaning method is cleaning with an application of ultrasonic vibrations to cleaning water in a spray.

As disclosed in Japanese Patent Application Laid-open Hei 7-86218 (1995), another scrub cleaning method of related art is performing brush (scrub) cleaning and ultrasonic cleaning at the same time. That is, a cleaning apparatus having a cleaner with a desk-shaped brush and a cleaning liquid ejector placed near the brush is used. An object to clean is scrubbed with the brush while a cleaning liquid to which ultrasonic vibrations are applied is ejected through the cleaning liquid ejector.

In the related-art cleaning method described with reference to FIG. 12 to FIG. 14 and in the other related-art method disclosed in the above-mentioned publication, however, a very small portion of cleaning liquid layer is only formed on the object surface. Consequently, particles of contaminants removed from the object and abrasion residues of the brush are likely to be taken in the cleaning liquid on the object surface and to redeposit on the surface.

In the related-art method, a very small portion of cleaning liquid layer is only formed on the object surface as well when ultrasonic cleaning is performed at the same time by applying ultrasonic vibrations to the cleaning liquid. It is therefore difficult to achieve effects of ultrasonic cleaning as expected.

SUMMARY OF THE INVENTION

It is a first object of the invention to provide a cleaning method and apparatus for preventing removed contaminants and abrasion residues of a brush from redepositing on an object to clean.

It is a second object of the invention to provide a cleaning method and apparatus for efficiently and effectively performing scrub cleaning and ultrasonic cleaning, in addition to the first object.

A cleaning method of the invention includes the steps of: having a cleaning liquid contained in a container for containing the cleaning liquid; retaining an object to clean in the cleaning liquid contained in the container; and cleaning the retained object by scrubbing with a brush in the cleaning liquid contained in the container.

In the method, the object is retained in the cleaning liquid contained in the container and cleaned through scrubbing with the brush.

In the cleaning method, it is preferred that ultrasonic vibrations are applied to the cleaning liquid contained in the container. Scrub cleaning with the brush and ultrasonic cleaning by ultrasonic vibrations are thereby performed on the object in the cleaning liquid contained in the container.

In the method, it is preferred that a position of the object is shifted in the cleaning liquid contained in the container.

In the method, it is preferred that an additional cleaning liquid is supplied to the container while the cleaning liquid is discharged from the container. The object cleaned in the method may be an intermediate product on which mechanical flattening is performed in a manufacturing process of a device having a plurality of layers.

A cleaning apparatus of the invention comprises: a container for containing a cleaning liquid; a means or device for retaining an object to clean in the cleaning liquid contained in the container; and a brush for cleaning the object retained by the means or device for retaining by scrubbing the object in the cleaning liquid contained in the container.

In the apparatus, the object is retained by the means or device for retaining in the cleaning liquid contained in the container and cleaned through scrubbing with the brush.

The cleaning apparatus preferably further comprises a means or device for applying ultrasonic vibrations to the cleaning liquid contained in the container. Scrub cleaning with the brush and ultrasonic cleaning by ultrasonic vibrations applied to the cleaning liquid by the means or device for applying are thereby performed on the object in the cleaning liquid contained in the container. In the cleaning apparatus the means or device for retaining preferably includes a means or device for shifting a position of the object in the cleaning liquid contained in the container.

The cleaning apparatus preferably further comprises a means or device for supplying an additional cleaning liquid to the container while discharging the cleaning liquid contained in the container. The object cleaned by the apparatus may be an intermediate product on which mechanical flattening is performed in a manufacturing process of a device having a plurality of layers.

Other and further objects, features and advantages of the invention will appear more fully from the following description.

DETAILED DESCRIPTION OF THE PREFERRED EMBODIMENT

A preferred embodiment of the invention will now be described in detail with reference to the accompanying drawings.

Figure 5:
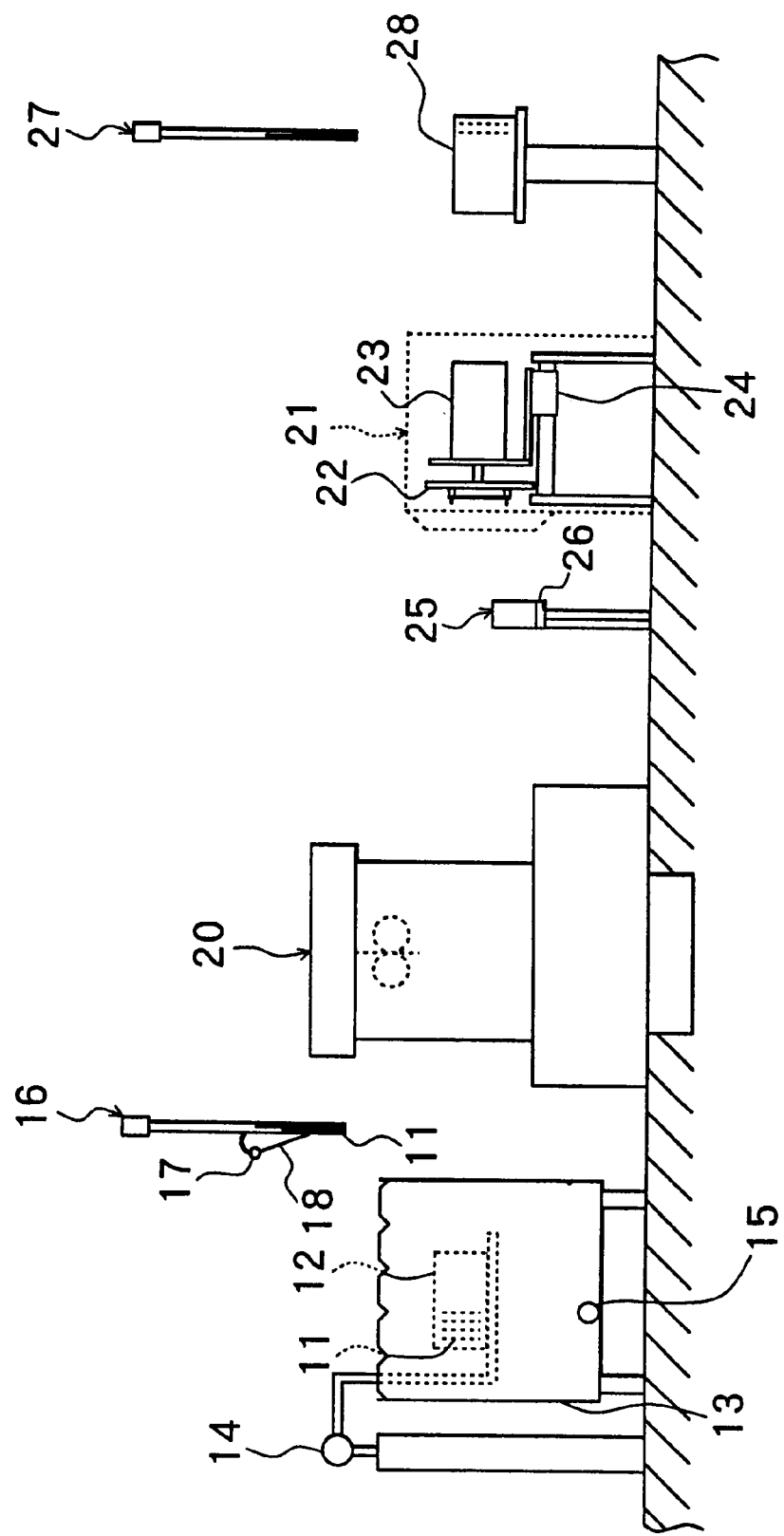
FIG. 5 is an explanatory view for illustrating a cleaning method and a cleaning process using the cleaning apparatus of the embodiment of the invention.

Referring to FIG. 5, a cleaning method and a cleaning process using a cleaning apparatus of the embodiment of the invention will now be described. An example wherein an object to clean is a wafer will be described. In the cleaning process a wafer 11 as an object to clean is placed in a carrier 12. The carrier 12 is accommodated in a loader bath 13. The carrier 12 is held in the loader bath 13 by an elevator 14 placed near the loader bath 13 so that the carrier 12 is capable of moving up and down. A ultrapure water supply port 15 is provided near the bottom of the loader bath 13. Ultrapure water is supplied to the loader bath 13 through the supply port 15. Excess ultrapure water is discharged from the upper rim of the loader bath 13. The amount of ultrapure water supplied to the loader bath 13 is 1.5 liters per minute, for example.

In the cleaning process shown in FIG. 5, the wafer 11 is taken out of the carrier 12 in the loader bath 13 and transferred to a cleaning apparatus 20 by a wafer transfer robot 16. The wafer transfer robot 16 has a nozzle 17 for applying ultrapure water 18 in a spray to the wafer 11 in order to prevent the wafer 11 from drying, and a duct for supplying ultrapure water to the nozzle 17.

The cleaning apparatus 20 of the embodiment performs scrub cleaning of the wafer 11 in a liquid. The configuration and operation of the cleaning apparatus 20 will be described in detail below. The wafer 11 after cleaning is taken out of the cleaning apparatus 20 and transferred to a spin dryer 21 by the robot 16.

The spin dryer 21 comprises a retainer 22 for retaining the wafer 11, a motor 23 for rotating the retainer 22, and an advancing and retreating mechanism 24 for shifting the retainer 22 and the motor 23 back and forth. The motor 23 rotates the retainer 22 at 1800 rpm, for example. In front of the spin dryer 21, a megasonic rinse apparatus 25 is provided for performing megasonic rinse on the wafer 11 retained by the retainer 22 through pouring ultrapure water to which an ultrasonic wave of about 1 MHz is applied. Near the megasonic rinse apparatus 25, a nozzle 26 is provided for applying a nitrogen ($N_2$) gas for drying to the wafer 11 retained by the retainer 22.

In the cleaning process shown in FIG. 5, rinsing by the megasonic rinse apparatus 25 and drying using the spin dryer 21 and the nozzle 26 are performed on the wafer 11 retained by the retainer 22 of the spin dryer 21.

The wafer 11 after rinsing and drying is taken out of the retainer 22 of the spin dryer 21 and placed in a carrier 28 of an unloader by a wafer transfer robot 27.

Figure 1:
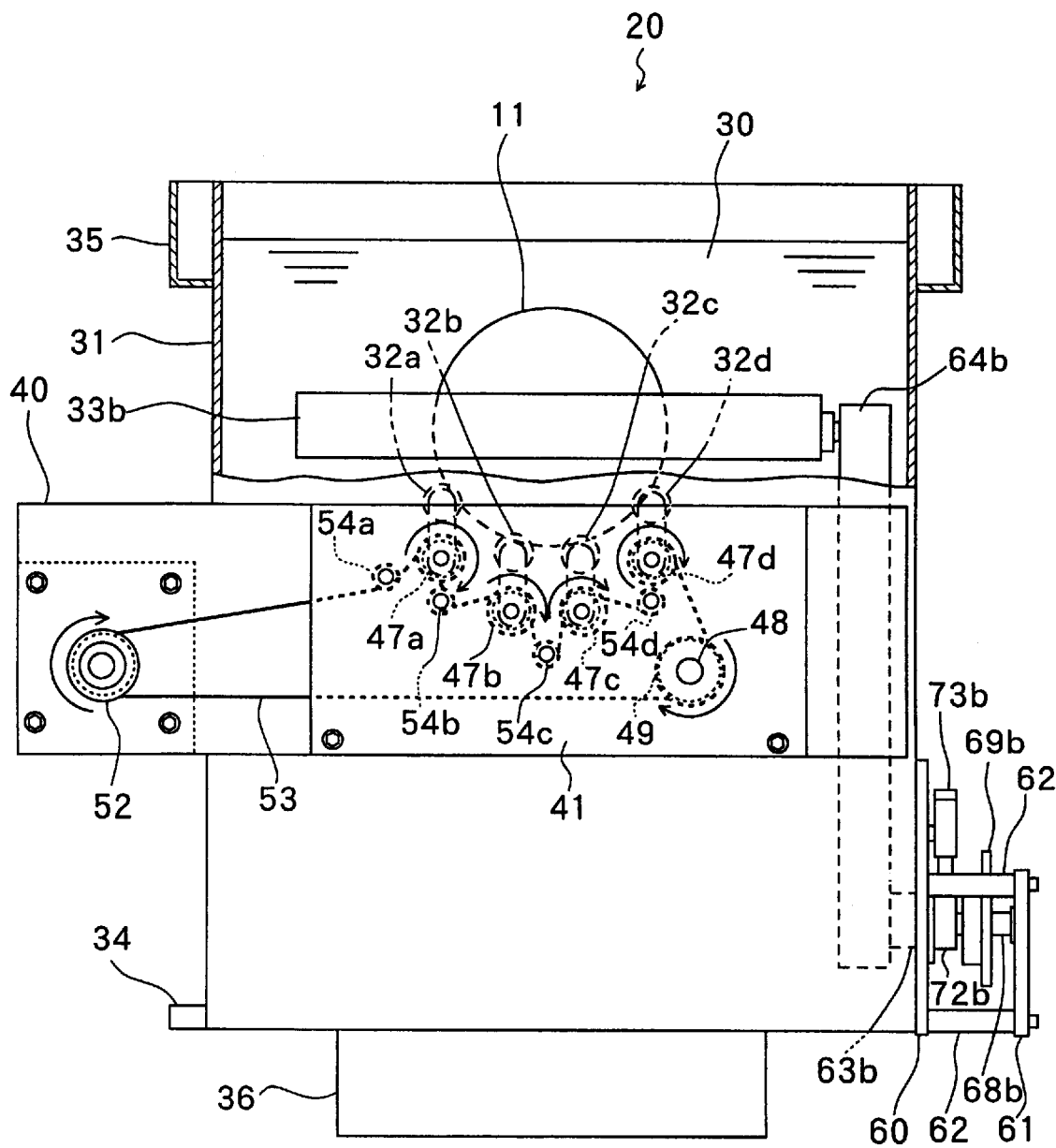
FIG. 1 is a partially cutout front view of a cleaning apparatus of an embodiment of the invention.
Figure 2:
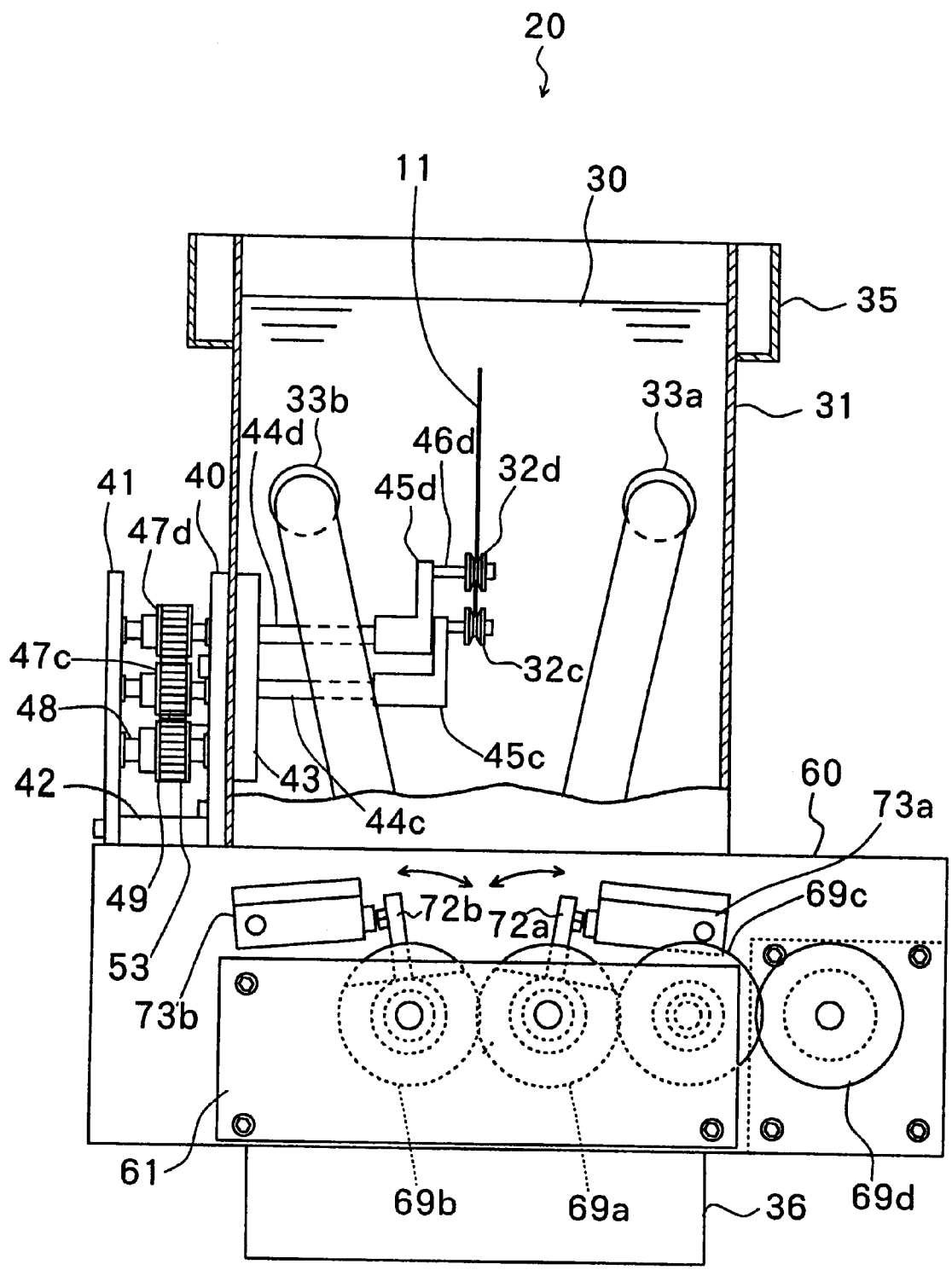
FIG. 2 is a partially cutout side view of the cleaning apparatus of the embodiment of the invention.
Figure 3:
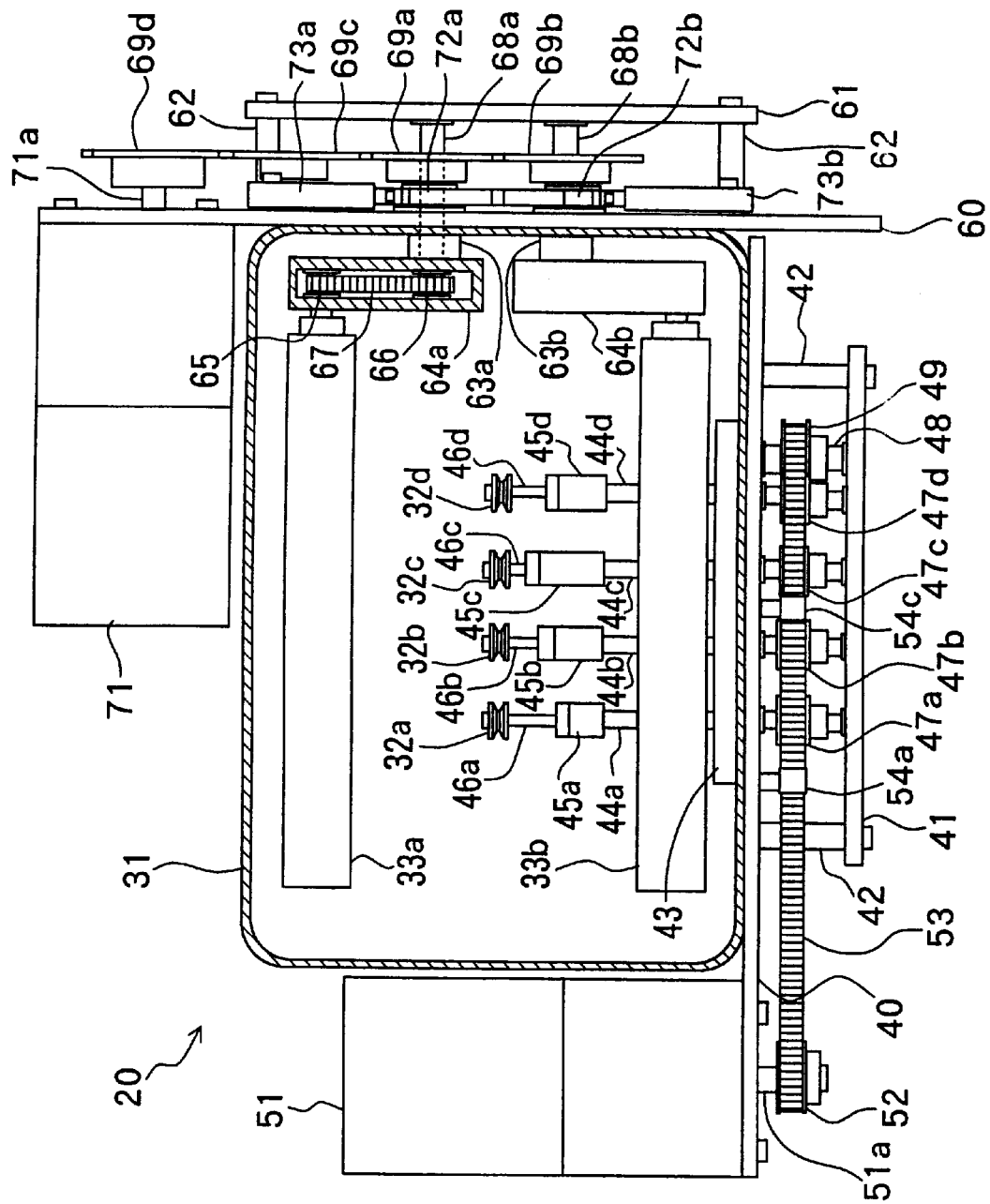
FIG. 3 is a partially cutout top view of the cleaning apparatus of the embodiment of the invention.
Figure 4A:
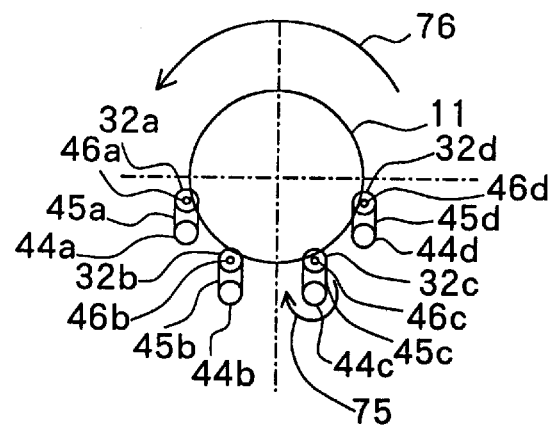
FIG. 4A to FIG. 4D are explanatory views for illustrating the operation of the wafer oscillation and rotation mechanism of the cleaning apparatus of the embodiment of the invention.
Figure 4B:
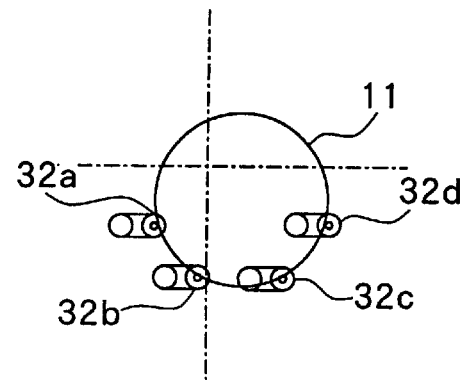
Figure 4C:
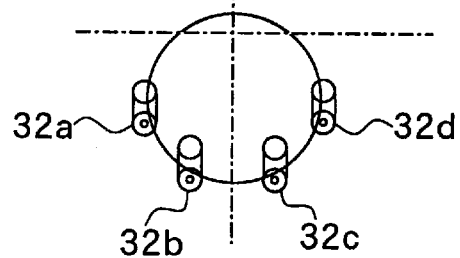
Figure 4D:
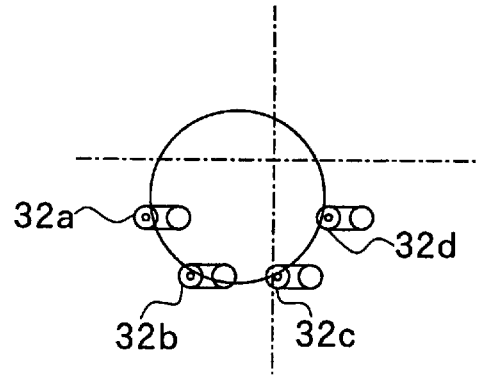

Referring to FIG. 1 to FIG. 3, the configuration of the cleaning apparatus 20 of the embodiment will now be described. FIG. 1 is a front view of the cleaning apparatus 20 part of which is cut away. FIG. 2 is a side view of the cleaning apparatus 20 part of which is cut away. FIG. 3 is a top view of the cleaning apparatus 20 part of which is cut away.

The cleaning apparatus 20 comprises: a cleaning bath 31 as a container for a cleaning liquid 30; four oscillation and rotation rollers 32a to 32d, placed in the cleaning bath 31, as a means or a device for retaining an object to clean, for retaining the wafer 11 as an object to clean in the cleaning liquid 30 contained in the cleaning bath 31; and two cylindrical brushes 33a and 33b, placed in the cleaning bath 31, for scrubbing and cleaning the wafer 11 retained by the rollers 32a to 32d in the cleaning liquid 30 contained in the cleaning bath 31.

The brushes 33a and 33b are each made of, for example, a cylindrical retainer around which a polyvinyl alcohol (PVA) sponge is wrapped or a plurality of ciliary fibers made of nylon (trade name), for example, are planted.

As shown in FIG. 1, a supply port 34 for supplying additional cleaning water into the cleaning bath 31 is provided at the bottom of the cleaning bath 31. As shown in FIG. 1 and FIG. 2, a gutter-like discharger 35 is placed around the external wall of the cleaning bath 31 near the upper rim for discharging cleaning water overflowing from the cleaning bath 31. The supply port 34 and the discharger 35 correspond to a means or a device for supplying of the invention.

As shown in FIG. 1 and FIG. 2, a ultrasonic generator 36 is placed at the bottom of the cleaning bath 31. The ultrasonic generator 36 is provided as a means or a device for applying ultrasonic vibrations to the cleaning liquid 30 contained in the cleaning bath 31.

The wafer oscillation and rotation mechanism using the rollers 32a to 32d will now be described in detail. A base 40 in the shape of a plate that is long from side to side is mounted on the front-part of the external wall of the cleaning bath 31. On the base 40 an axis support plate 41 is mounted via a spacer 42 to face the base 40 with a given space. A bearing 43 is fixed to the front-part of the internal wall of the cleaning bath 31. Four roller drive axes 44a to 44d are provided to penetrate the bearing 43, the front-part of the external wall of the cleaning bath 31, and the base 40 in the horizontal direction. The roller drive axes 44a to 44d are rotatably supported by the bearing 43. Arms 45a to 45d extend in the direction orthogonal to the roller drive axes 44a to 44d. Ends of the arms 45a to 45d are coupled to ends of the roller drive axes 44a to 44d placed in the cleaning bath 31. Roller axes 46a to 46d are placed in parallel to the roller drive axes 44a to 44d. Ends of the roller axes 46a to 46d are coupled to the other ends of the arms 45a to 45d. The oscillation and rotation rollers 32a to 32d are fixed to the other ends of the roller axes 46a to 46d. The arms 45a to 45d are equal to one another in length and extend in one direction from the roller drive axes 44a to 44d. The rollers 32a to 32d are placed along the lower part of the periphery of the wafer 11 so as to retain the wafer 11 placed along the vertical direction at the lower side.

The other ends of the roller drive axes 44a to 44d are rotatably supported by the axis support plate 41. Timing pulleys 47a to 47d are each attached to the roller drive axes 44a to 44d, respectively, between the base 40 and the axis support plate 41. An axis 48 is rotatably installed between the base 40 and the axis support plate 41. A timing pulley 49 is attached to the axis 48.

A waterproof motor 51 for wafer oscillation and rotation is mounted on the surface of the base 40 on the side of the cleaning bath 31. A drive axis 51a of the motor 51 penetrates the base 40 and projects from the axis support plate 41. A timing pulley 52 is attached to the drive axis 51a. A timing belt 53 is wrapped around the timing pulleys 52, 47a to 47d and 49. Near the timing pulleys 47a to 47d, tension pulleys 54a to 54d attached to the base 40 are provided. The timing belt 53 goes through the tension pulleys 54a to 54d.

In the wafer oscillations and rotation mechanism of such a configuration, the timing pulleys 47a to 47d are rotated in the same direction through the timing pulley 52 and the timing belt 53 by rotating the motor 51. The roller drive axes 44a to 44d are thereby rotated in the same direction and the arms 45a to 45d are rotated in the same direction around the roller drive axes 44a to 44d. As a result, the rollers 32a to 32d make circular motion in the same direction around the roller drive axes 44a to 44d. The wafer 11 retained by the rollers 32a to 32d is thereby oscillated and rotated.

The rotation and opening and closing mechanism of the brushes 33a and 33b will now be described. A base 60 in the shape of a plate that is long from side to side is mounted on the right side of the external wall of the cleaning bath 31. On the base 60 an axis support plate 61 is mounted via a spacer 62 to face the base 60 with a given space. Two cylindrical axis cases 63a and 63b are rotatably provided to penetrate the right side of the external wall of the cleaning bath 31 and the base 60 in the horizontal direction. Lower ends of hallow arm-shaped timing belt cases 64a and 64b are coupled to ends of the axis cases 63a and 63b in the cleaning bath 31. The timing belt cases 64a and 64b vertically extend in the cleaning bath 31.

Timing pulleys 65 and 66 are each rotatably placed near the upper end and the lower end, respectively, in the timing belt cases 64a and 64b. The axes of the brushes 33a and 33b each pass through the timing belt cases 64a and 64b and are coupled to the respective timing pulleys 65 in the timing belt cases 64a and 64b. Timing belts 67 are each wrapped around the timing pulleys 65 and 66 in the timing belt cases 64a and 64b, respectively.

Ends of the brush drive axes 68a and 68b are each coupled to the respective timing pulleys 66 in the timing belt cases 64a and 64b, respectively. The brush drive axes 68a and 68b go through the axis cases 63a and 63b. The other ends of the brush drive axes 68a and 68b are rotatably supported by the axis support plate 61. Brush drive gears 69a and 69b are attached to the brush drive axes 68a and 68b, respectively, between the base 60 and the axis support plate 61. The brush drive gears 69a and 69b mesh with each other.

A brush drive gear 69c that meshes with the gear 69a and a brush drive gear 69d that meshes with the gear 69c are further provided between the base 60 and the axis support plate 61. The brush drive gears 69c and 69d are supported by the base 60 and the axis support plate 61. The four brush drive gears 69a to 69d are equal to one another in diameter and the number of teeth. A waterproof motor 71 for driving the brushes is mounted on the surface of the base 60 on the side of the cleaning bath 31. A drive axis 71a of the motor 71 penetrates the base 60 and is coupled to the brush drive gear 69d.

Levers 72a and 72b for opening and closing the brushes are each fitted to the axis cases 63a and 63b between the base 60 and the axis support plate 61. Part of the base of the levers 72a and 72b form gears and the gears mesh with each other. The extremities of the levers 72a and 72b extend upward.

Two cylinders 73a and 73b for opening and closing the brushes are mounted on the base 60. Plungers of the cylinders 73a and 73b are each coupled to near the extremities of the levers 72a and 72b.

In the mechanism of rotating, opening and closing the brushes 33a and 33b of such a configuration, the brush drive gears 69d, 69c, 69a and 69b are rotated by rotating the motor 71. The brush drive axes 68a and 68b are thereby rotated in the directions opposite to each other. The rotations of the brush drive axes 68a and 68b are transferred to the brushes 33a and 33b through the timing pulley 66, the timing belt 68 and the timing pulley 65. The brushes 33a and 33b are thereby rotated in the directions opposite to each other.

The levers 72a and 72b are turned by moving the plungers of the cylinders 73a and 73b back and forth. The axis cases 63a and 63b coupled to the levers 72a and 72b and the timing belt cases 64a and 64b are thereby turned and the brushes 33a and 33b are opened and closed.

The operation of the cleaning apparatus 20 of the embodiment will now be described. The following description applies to a cleaning method of the embodiment as well.

For cleaning the wafer 11 by the cleaning apparatus 20, the cleaning liquid 30 is supplied into the cleaning bath 31 through the supply port 34. The cleaning liquid 30 is ultrapure water or detergent.

Leaving the brushes 33a and 33b open, the wafer 11 is inserted to the cleaning bath 31 and placed on the rollers 32a to 32d by the wafer transfer robot 16 so that the wafer 11 is retained by the rollers 32a to 32d. The cylinders 73a and 73b are then operated and the brushes 33a and 33b are closed. The wafer 11 is held by the brushes 33a and 33b.

Next, the additional cleaning liquid 30 is supplied into the cleaning bath 31 through the supply port 34. While discharging the excess cleaning liquid 30, the brushes 33a and 33b are rotated by rotating the motor 71. The wafer 11 is oscillated and rotated by rotating the motor 51. Furthermore, the ultrasonic generator 36 is operated so that ultrasonic vibrations are applied to the cleaning liquid 30 in the cleaning bath 31. Although it is preferred to perform both oscillation and rotation of the wafer 11 and an application of ultrasonic vibrations during cleaning in the embodiment, it is not always required to perform both. In some cases either oscillation and rotation or an ultrasonic application may be omitted or both may be omitted.

In such a manner the surface of the wafer 11 is scrubbed by the brushes 33a and 33b and scrub cleaning is performed on the wafer 11. At the same time, ultrasonic vibrations are applied to the wafer 11 in the cleaning liquid 30 and ultrasonic cleaning is performed on the wafer 11.

The amount of cleaning liquid 30 supplied is preferably 1 liter or more per minute. In the embodiment the amount is 2 liter per minute, for example. The cleaning liquid 30 supplied is preferably heated. The temperature of the liquid 30 is preferably 30 to 70° C. In the embodiment the temperature is 50° C., for example.

The number of rotations of the brushes 33a and 33b is preferably 30 to 200 rpm. In the embodiment the number of rotations is 50 rpm, for example.

The ultrasonic vibration generated by the ultrasonic generator 36 is preferably 28 to 200 kHz. In the embodiment the ultrasonic vibration is 28 kHz, for example.

Referring to FIG. 4A to FIG. 4D, the operation of the wafer oscillation and rotation mechanism will now be described in detail. FIG. 4A to FIG. 4D illustrate the wafer 11 and the rollers 32a to 32d where the positions of the roller drive axes 44a to 44d are shifted by 45 degrees. The roller drive axes 44a to 44d are all rotated in the direction shown with a numeral 75 in FIG. 4A. Consequently, as shown in FIG. 4A to FIG. 4D, the rollers 32a to 32d each make circular motion around the roller drive axes 44a to 44d. The wafer 11 retained by the rollers 32a to 32d is thereby vertically and horizontally oscillated. Since the rollers 32a to 32d are fixed to the arms 45a to 45d coupled to the roller drive axes 44a to 44d through the roller axes 46a to 46d, the wafer 11 is rotated in the direction indicated with the numeral 76 in FIG. 4A by means of circular motion of the rollers 32a to 32d.

The intensity of ultrasonic vibrations could be nonuniform in the cleaning bath 31. By oscillating and rotating the wafer 11 in the cleaning bath 31 as described above, ultrasonic vibrations whose average intensity is nearly uniform are applied to the wafer 11.

The range of oscillation of the wafer 11 by the oscillation and rotation mechanism preferably falls within the range between 10 and 30 mm from the center of oscillation in the vertical and horizontal directions, respectively, wherein the diameter of the wafer 11 is three inches, for example. In the embodiment the range is 15 mm, for example, from the center of oscillation in the vertical and horizontal directions, respectively. The number of rotations of the wafer 11 by the oscillation and rotation mechanism preferably falls within the range between 20 and 100 rpm. The number of rotations is 40 rpm, for example, in the embodiment.

According to the cleaning apparatus 20 and the cleaning method of the embodiment described so far, scrub cleaning is performed on an object to clean (the wafer 11) through scrubbing the surface of the object by the brushes 33a and 33b in the cleaning liquid 30 contained in the cleaning bath 31. As a result, contaminants removed from the object and abrasion residues of the brushes 33a and 33b are easily dispersed throughout the cleaning liquid 30 in the cleaning bath 31. In addition, cleaning liquid layers containing few contaminants are likely to be formed between the object and the brushes 33a and 33b. Redeposition of contaminants removed from the object and abrasion residues of the brushes on the object is thereby suppressed. Cleaning efficiency of the object is thus improved.

According to the cleaning apparatus 20 and the cleaning method of the embodiment, the additional cleaning liquid 30 is supplied to the cleaning bath 31 through the supply port 34 while discharging the cleaning liquid 30 in the cleaning bath 31 through the discharger 35 during scrub cleaning of the object by the brushes 33a and 33b. As a result, the cleaning liquid 30 in the cleaning bath 31 is kept clean and cleaning efficiency of the object is further improved.

According to the cleaning apparatus 20 and the cleaning method of the embodiment, ultrasonic cleaning is performed on the object through applying ultrasonic vibrations to the object in the cleaning liquid 30 together with the scrub cleaning described above. As a result, ultrasonic vibrations are applied to the whole object through the cleaning liquid 30 and scrub cleaning and ultrasonic cleaning are efficiently and effectively performed. Cleaning efficiency of the object is further improved, accordingly.

According to the cleaning apparatus 20 and the cleaning method of the embodiment, the object is oscillated and rotated in the cleaning bath 31. As a result, ultrasonic vibrations whose average intensity is nearly uniform are applied to the whole region of the object. Cleaning efficiency of the object is further improved, accordingly.

According to the cleaning apparatus 20 and the cleaning method of the embodiment, the brushes 33a and 33b are cleaned as well during cleaning of the object since the brushes 33a and 33b are placed in the cleaning liquid 30. Operations accompanying the cleaning are thereby simplified. Since the brushes 33a and 33b are always wet with the cleaning liquid 30, damage to the object is prevented when the object is first brought to contact with the brushes 33a and 33b. A mechanism of preventing the brushes from drying is no more necessary that is required in a related-art apparatus for preventing damage to the object.

In the related-art technique it is required to transfer the object to a rinse apparatus and perform rinsing after scrub cleaning of the object by the scrub cleaning apparatus. According to the cleaning apparatus 20 and the cleaning method of the embodiment, in contrast, ultrasonic vibrations are applied to the cleaning liquid 30 in the cleaning bath 31 by the ultrasonic generator 36 without rotating the brushes 33a and 33b after scrub cleaning and ultrasonic cleaning of the object. As a result, ultrasonic rinsing is immediately performed on the object without transferring the object. Scrub cleaning and rinsing that follows are thus efficiently performed.

Figure 6:
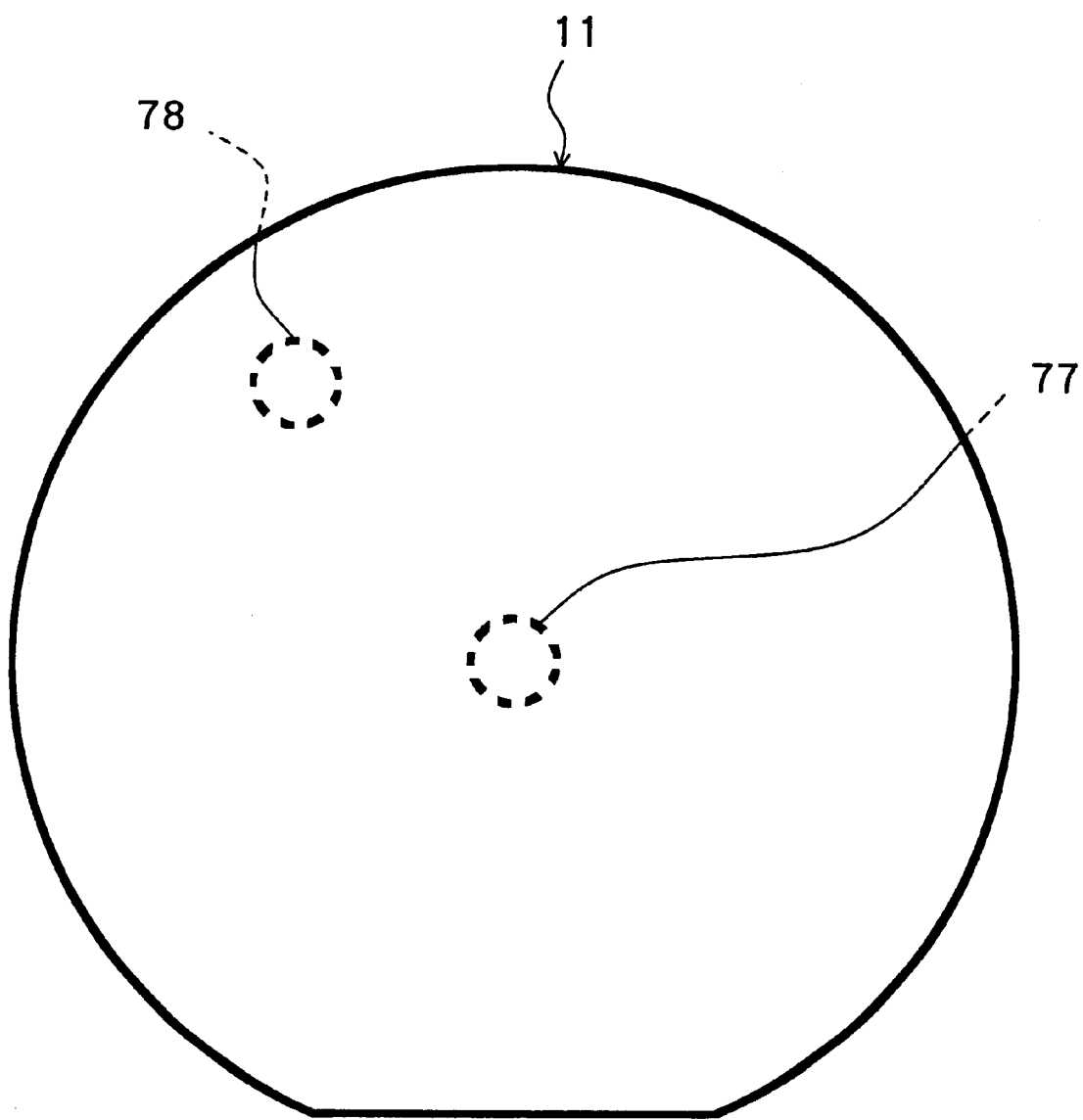
FIG. 6 is an explanatory view for illustrating inspection regions defined for examining the quality of the object after cleaning.
Figure 13:
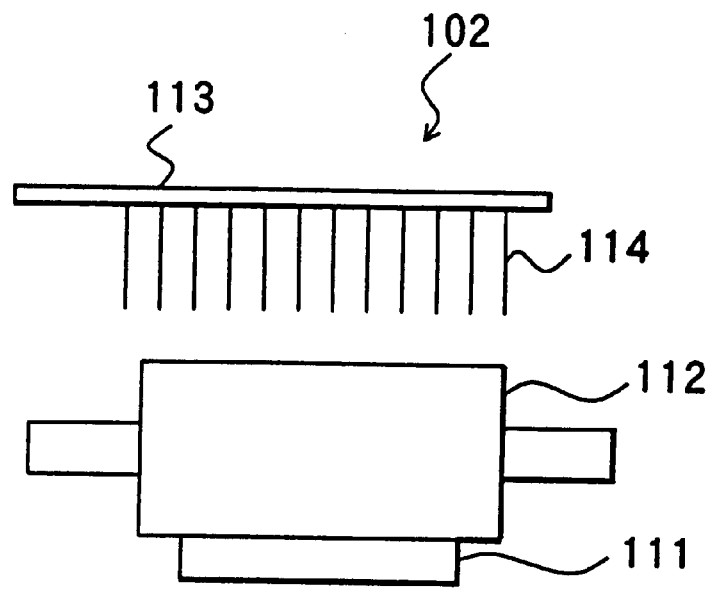
FIG. 13 is a schematic front view of the scrub cleaning apparatus shown in FIG. 12.
Figure 14:
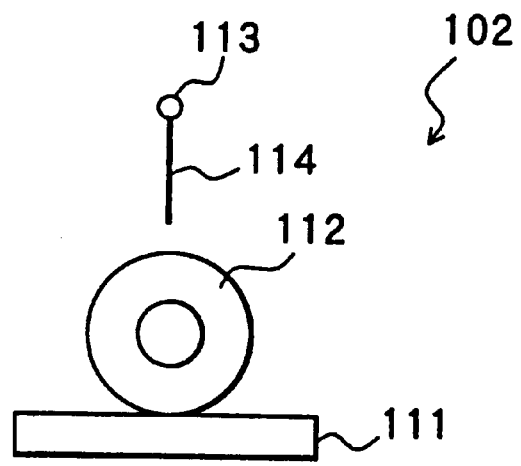
FIG. 14 is a schematic side view of the scrub cleaning apparatus shown in FIG. 12.

An example will now be described wherein the qualities of the objects after cleaning are compared between scrub cleaning using the related-art apparatus shown in FIG. 13 and FIG. 14 and cleaning by the apparatus 20 of the embodiment of the invention. In the example, as shown in FIG. 6, rectangular inspection regions of 140 $\mu$m by 190 $\mu$m are each determined in two portions of the wafer 11, that is, a central part 77 and a part 78 near the perimeter, respectively. The inspection regions are each magnified by 200 times and observed, using a metallurgical microscope, and the number of particles of 1 $\mu$m or above are counted. The result is that the average number of particles of 1 $\mu$m or above in the two inspection regions is 125 when scrub cleaning using the related-art apparatus is performed. The number of such particles is three when cleaning is performed by the apparatus 20 of the embodiment of the invention. The quality of the object after cleaning is thus dramatically improved by cleaning using the apparatus 20 of the embodiment, compared to scrub cleaning using the related-art apparatus.

An object to be cleaned by the cleaning apparatus 20 and the method of the embodiment may be a substrate in general or an object having microscopic asperities (about 0.1 to 2 μm) essential to the object on its surface. Such an object may be an intermediate product on which mechanical flattening is performed in a manufacturing process of a device having a plurality of layers. The cleaning method and apparatus of the embodiment may be applied to removing contaminants like shavings and slurry used for polishing deposited on such an intermediate product.

As an example of such an intermediate product cleaned by the apparatus 20 and the method of the embodiment, an intermediate product in a manufacturing process of a thin-film magnetic head will now be described.

Figure 7:
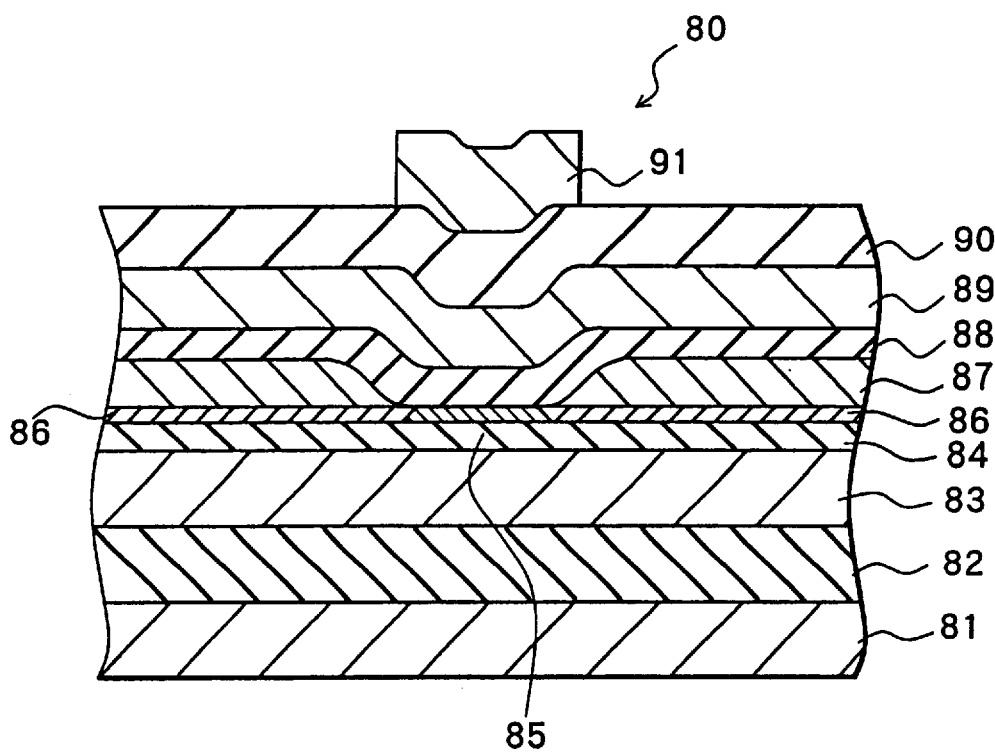
FIG. 7 is a cross section of an example of a related-art thin-film magnetic head.

Referring to a cross section shown in FIG. 7, an example of the configuration of a related-art thin-film magnetic head will now be described for comparison with the intermediate product in a manufacturing process of a thin-film magnetic head to which the embodiment is applied. A thin-film magnetic head 80 shown in FIG. 7 is a composite head wherein a magnetoresistive (MR) head for reproduction only with an MR element and a thin-film head for recording made of a combination of a magnetic thin film and a flat coil are integrated. The thin-film magnetic head 80 comprises a substrate protect layer 82, a bottom shield film 83, a bottom gap film 84, an MR film 85 and a hard magnetic film 86, a terminal 87, a top gap film 88, a top shield-cum-bottom pole 89, a light gap film 90, and a top pole 91, each being stacked on a substrate (wafer) 81 in order. Although not shown in FIG. 7, a coil is formed on the light gap film 90 with an insulating layer in between.

The substrate 81 may be made of aluminum oxide and titanium carbide ($Al_2O_3$-TiC). The substrate protect layer 82, the bottom gap film 84, the top gap film 88, and the light gap film 90 may be made of $Al_2O_3$. The bottom shield film 83 may be made of FeAlSi or NiFe. The MR film 85 may be made of NiFe that exhibits the magnetoresistive effect. The thin-film magnetic head may comprise a giant magnetoresistive (GMR) film that exhibits the GMR effect instead of the MR film 85. The hard magnetic film 86 may be made of CoPt. The terminal 87 may be made of Ta. The top shield-cum-bottom pole 89 and the top pole 91 may be made of NiFe.

In the thin-film magnetic head 80 shown in FIG. 7, the surface of the MR film 85 and the hard magnetic film 86 is flat. However, there is a step (a difference in level) in the top gap film 88 since the terminal 87 is formed on the surface of the hard magnetic film 86 other than the surface on which the bottom gap film 84 is formed, and the top gap film 88 is formed to cover the MR film 85 and the terminal 87. In the thin-film magnetic head 80, the top shield-cum-bottom pole 89, the light gap film 90 and the top pole 91 are formed in order on the surface of the top gap film 88 with the step other than the surface on which the terminal 87 is formed. Accordingly, the light gap film 90 is curved between the top shield-cum-bottom pole 89 and the top pole 91.

Figure 8:
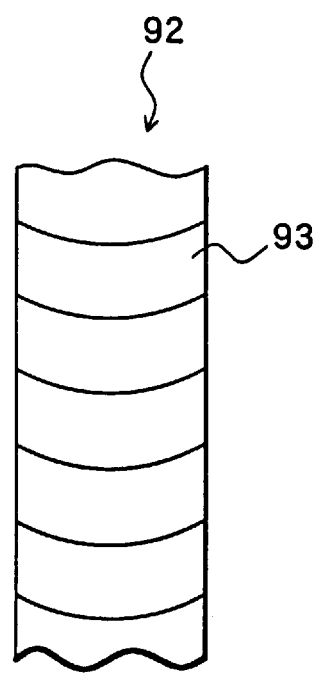
FIG. 8 schematically illustrates a recording region of one track when recording is made on a hard disk by the thin-film magnetic head shown in FIG. 7.

FIG. 8 schematically illustrates a recording region of one track when recording is made on a hard disk by the thin-film magnetic head 80 shown in FIG. 7. A numeral 92 indicates the track. A numeral 93 indicates the recording region of one bit. As shown, since the light gap film 90 is curved between the top shield-cum-bottom pole 89 and the top pole 91, the recording region 93 is curved as well. If the recording region 93 is curved, the half width of a reproducing signal from the recording region 93 is increased. It is therefore impossible to increase the recording density.

Figure 9:
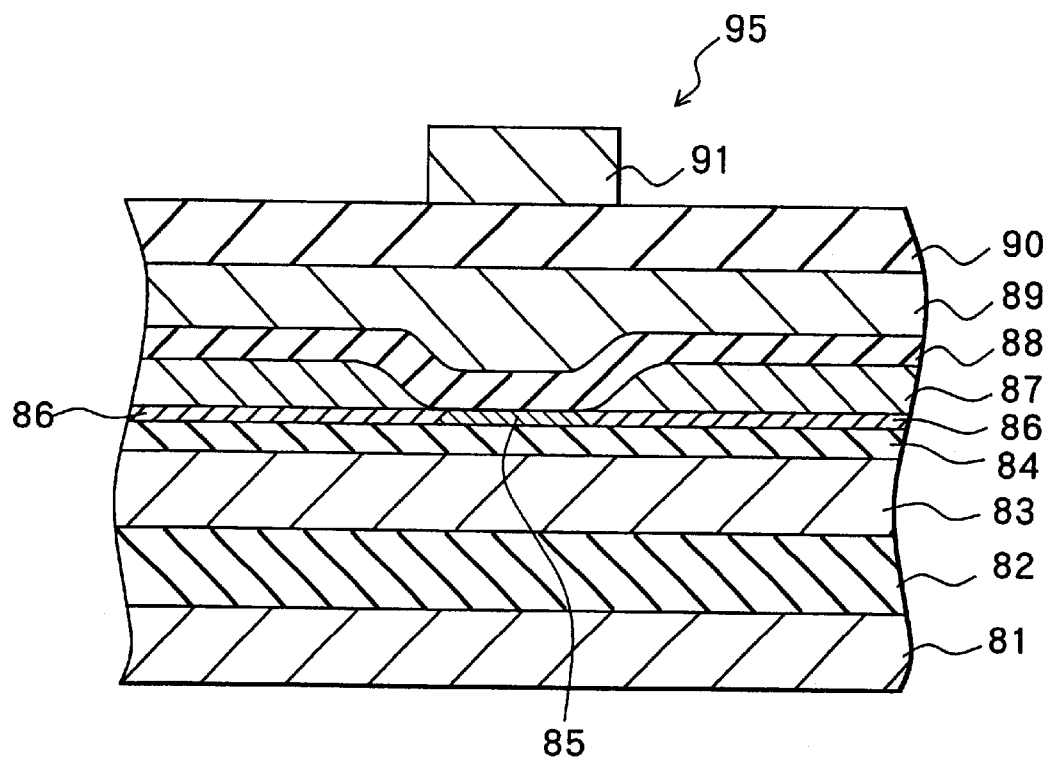
FIG. 9 is a cross section of a thin-film magnetic head wherein a light gap film is flattened.

A thin-film magnetic head 95 shown in FIG. 9 is provided in order to solve such a problem. In the thin-film magnetic head 95, the surface of the top shield-cum-bottom pole 89 opposite to the top gap film 88 is flattened. Accordingly, the light gap film 90 and the top pole 91 are flattened as well. The remainder of the configuration of the thin-film magnetic head 95 is similar to that of the thin-film magnetic head 80 shown in FIG. 7.

Figure 10:
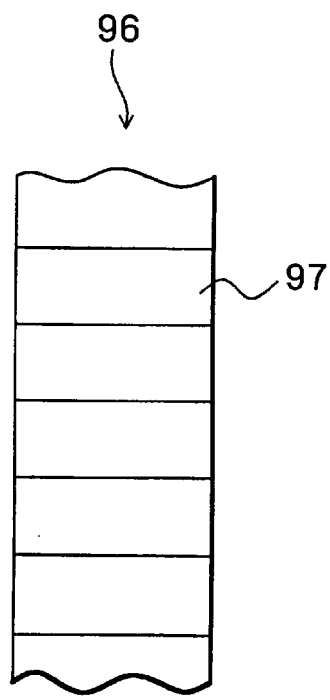
FIG. 10 schematically illustrates a recording region of one track when recording is made on a hard disk by the thin-film magnetic head shown in FIG. 9.

FIG. 10 schematically illustrates a recording region of one track when recording is made on a hard disk by the thin-film magnetic head 95 shown in FIG. 9. A numeral 96 indicates the track. A numeral 97 indicates the recording region of one bit. As shown, since the light gap film 90 is flat between the top shield-cum-bottom pole 89 and the top pole 91, the recording region 97 is nearly a rectangle. If the recording region 97 is nearly a rectangle, the half width of a reproducing signal from the recording region 97 is reduced. It is therefore possible to increase the recording density.

Figure 11:
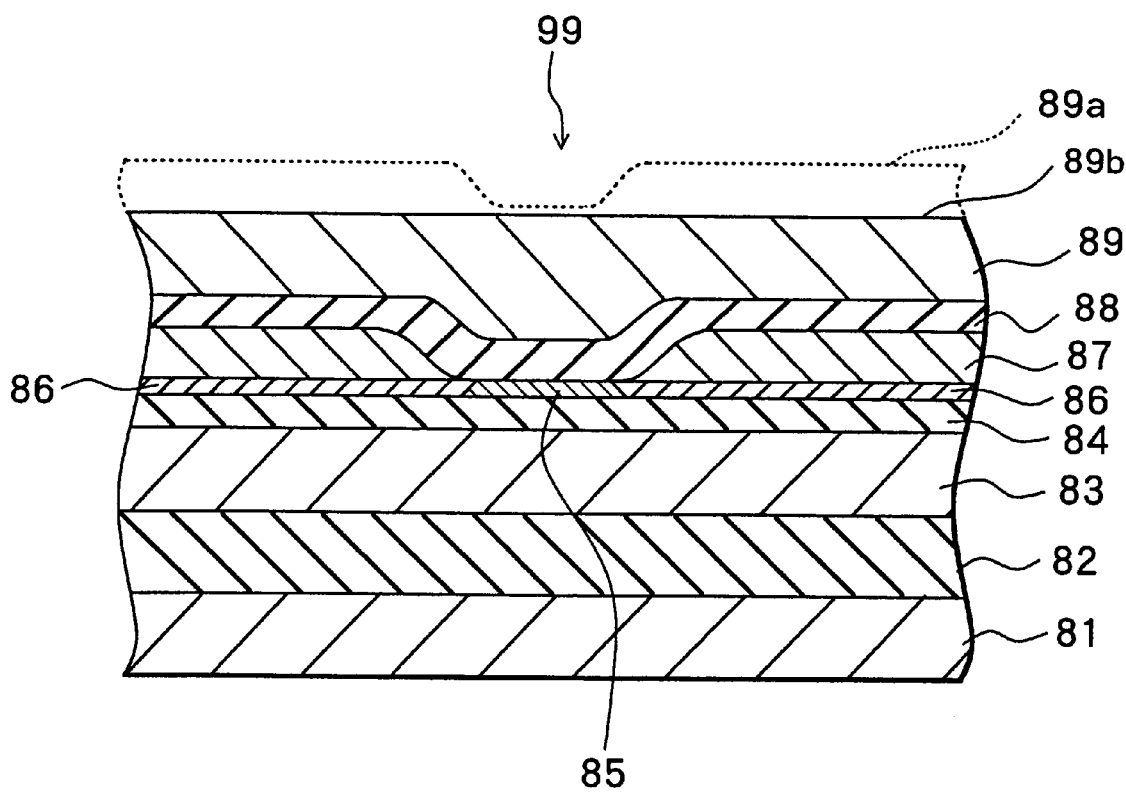
FIG. 11 is a cross section of an intermediate product of the thin-film magnetic head shown in FIG. 9.
Figure 12:
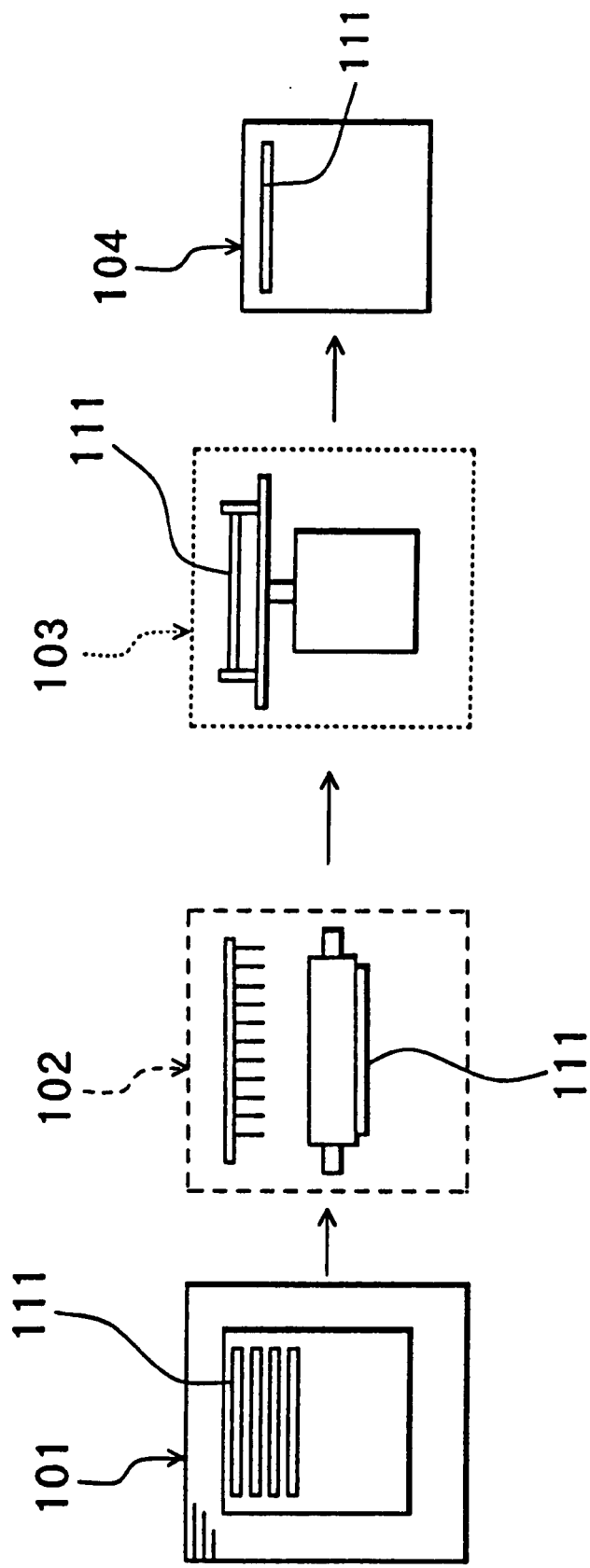
FIG. 12 is an explanatory view of an example of a scrub cleaning process of related art.

In the manufacturing process of the thin-film magnetic head 95 shown in FIG. 9, it is required to flatten the surface of the top shield-cum-bottom pole 89 opposite to the top gap film 88 after formation of the top shield-cum-bottom pole 89. FIG. 11 shows an intermediate product 99 of the thin-film magnetic head wherein the top shield-cum-bottom pole 89 is flattened. A numeral 89a indicates the position of the surface of the top shield-cum-bottom pole 89 before flattened. A numeral 89b indicates the position of the surface of the top shield-cum-bottom pole 89 after flattened.

In order to flatten the top shield-cum-bottom pole 89, chemical and mechanical flattening such as chemical mechanical polishing (CMP) is used. An object to which the embodiment is applied may be the intermediate product 99 wherein mechanical flattening is performed on the top shield-cum-bottom pole 89, as shown in FIG. 11, in the manufacturing process of the thin-film magnetic head 95 shown in FIG. 9. Contaminants such as shavings resulting from mechanical flattening and slurry used for polishing are deposited on the surface of the intermediate product 99 on which mechanical flattening is performed, especially on the surface of the top shield-cum-bottom pole 89. Such contaminants are removed by the cleaning apparatus 20 and the cleaning method of the embodiment. A plurality of intermediate products 99 are formed on the substrate (wafer) 81. Cleaning of the intermediate products 99 is thus performed in a manner similar to that of cleaning the wafer 11 of the embodiment. The object to clean, that is, the substrate (wafer) 81 on which a plurality of intermediate products 99 are formed has microscopic asperities essential to the object on its surface to be cleaned.

If the cleaning apparatus 20 and the cleaning method of the embodiment are applied to the intermediate product 99 on which mechanical flattening is performed as shown in FIG. 11, contaminants such as shavings resulting from such mechanical flattening and slurry used for polishing are effectively removed. As a result, the thin-film magnetic head 95 of high quality is manufactured. Particularly, if the object to clean to which the apparatus 20 and the method of the embodiment are applied has microscopic asperities on its surface, contaminants easily deposited in the asperities are effectively removed.

The invention is not limited to the foregoing embodiment. For example, although the object to clean is placed along the vertical direction in the cleaning bath 31 in the embodiment, the object may be placed in the horizontal direction. In this case, the brushes 33a and 33b are placed to hold the object in the vertical direction. The rollers 32a to 32d for retaining, oscillating and rotating the object are arranged at regular intervals along the periphery of the object placed along the horizontal direction and retain the object at the underside. The rollers 32a to 32d each make circular motion around the roller drive axes arranged in the vertical direction.

Although the intermediate product of the composite thin-film magnetic head wherein the MR head and the thin-film head are integrated is described as an example of the object to clean in the foregoing embodiment, the invention may be applied to an intermediate product of a thin-film magnetic head including no MR head. The order in which the layers of such an intermediate product of the thin-film magnetic head are stacked is not particularly defined. The invention may be applied to any other object such as an intermediate product in a semiconductor manufacturing process.

According to the cleaning method and the cleaning apparatus of the invention thus described, the object is cleaned by scrubbing with the brushes in the cleaning liquid contained in the container. As a result, redeposition of contaminants removed from the object and abrasion residues of the brushes on the object is suppressed.

According to the cleaning method and the cleaning apparatus of the invention, ultrasonic vibrations are applied to the cleaning liquid contained in the container. As a result, scrub cleaning and ultrasonic cleaning are efficiently and effectively performed.

According to the cleaning method and the cleaning apparatus of the invention, the position of the object is shifted in the cleaning liquid contained in the container. As a result, ultrasonic vibrations whose average intensity is nearly uniform are applied to the whole region of the object. Cleaning efficiency of the object is further improved, accordingly.

According to the cleaning method and the cleaning apparatus of the invention, an additional cleaning liquid is supplied to the container while discharging the cleaning liquid from the container. As a result, cleaning efficiency of the object is further improved.

According to the cleaning method and the cleaning apparatus of the invention, the object is an intermediate product on which mechanical flattening is performed in a manufacturing process of a device having a plurality of layers. As a result, contaminants resulting from mechanical flattening are effectively removed from the intermediate product and the device of high quality is produced.

Obviously many modifications and variations of the present invention are possible in the light of the above teachings. It is therefore to be understood that within the scope of the appended claims the invention may be practiced otherwise than as specifically described.

What is claimed is:

1. A cleaning method including the steps of:
   containing a cleaning liquid in a container;
   immersing an object to be cleaned in the cleaning liquid contained in the container;
   cleaning the immersed object by scrubbing with a brish immersed in the cleaning liquid contained in the container; and
   oscillating the immersed object vertically and horizontally during the cleaning in the cleaning liquid contained in the container.

2. A cleaning method according to claim 1, further including the step of applying ultrasonic vibrations to the cleaning liquid contained in the container.

3. A cleaning method according to claim 1, wherein the immersed object is rotated simultaneously while being oscillated in the container.

4. A cleaning method according to claim 1, further including the step of supplying an additional cleaning liquid to the container while the cleaning liquid is discharged from the container during the cleaning of the immersed object.

5. A cleaning method according to claim 1, wherein the object is an intermediate product on which mechanical flattening is performed in a manufacturing process of a device having a plurality of layers.

6. A cleaning method according to claim 1, wherein the step of oscillating the immersed object oscillates the immersed object using a mechanism for oscillating the object vertically and horizontally with a single movement.

7. A cleaning method according to claim 3, wherein the step of oscillating the immersed object rotates and oscillates the immersed object using a mechanism for rotating amd oscillating the object vertically and horizontally with a single movement.

* * * * *